United States Patent
Marsh (12)

(10) Patent No.: US 6,323,511 B1
(45) Date of Patent: Nov. 27, 2001

(54) STRUCTURES INCLUDING LOW CARBON/ OXYGEN CONDUCTIVE LAYERS

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/382,042

(22) Filed: Aug. 24, 1999

Related U.S. Application Data

(62) Division of application No. 09/146,297, filed on Sep. 3, 1998.

(51) Int. Cl.$^7$ .................................................. H01L 29/76
(52) U.S. Cl. ............................ 257/295; 257/768; 257/769; 438/680
(58) Field of Search .................................... 438/680, 681, 438/674, 675, 239–241, 243–245, 250, 251; 257/295, 370, 791, 768, 769

(56) References Cited

U.S. PATENT DOCUMENTS

| | | | |
|---|---|---|---|
| 3,839,164 | * 10/1974 | Hurst ........................................ 205/86 |
| 4,830,982 | * 5/1989 | Dentai et al. ........................ 117/104 |
| 4,992,305 | 2/1991 | Erbil ...................................... 427/252 |
| 5,096,737 | 3/1992 | Baum et al. .......................... 427/573 |
| 5,130,172 | 7/1992 | Hicks et al. ........................... 427/252 |
| 5,149,596 | 9/1992 | Smith et al. .......................... 428/656 |
| 5,187,638 | 2/1993 | Sandhu et al. ....................... 361/313 |
| 5,198,386 | 3/1993 | Gonzalez .............................. 438/253 |
| 5,220,044 | 6/1993 | Baum et al. ............................ 556/40 |
| 5,232,873 | * 8/1993 | Geva et al. ............................ 437/192 |
| 5,252,518 | * 10/1993 | Sandhu et al. ........................ 437/200 |
| 5,270,241 | 12/1993 | Dennison et al. .................... 438/396 |
| 5,341,016 | 8/1994 | Prall et al. . |
| 5,354,712 | * 10/1994 | Ho et al. .............................. 438/643 |
| 5,372,849 | 12/1994 | McCormick et al. . |
| 5,392,189 | 2/1995 | Fazan et al. . |
| 5,403,620 | 4/1995 | Kaesz et al. . |
| 5,464,786 | 11/1995 | Figura et al. ......................... 438/396 |
| 5,478,772 | 12/1995 | Fazan ................................... 438/396 |
| 5,480,684 | 1/1996 | Sandhu . |
| 5,487,923 | 1/1996 | Min et al. . |
| 5,498,562 | 3/1996 | Dennison et al. .................... 438/253 |
| 5,506,166 | 4/1996 | Sandhu et al. ....................... 438/396 |
| 5,510,651 | 4/1996 | Maniar et al. . |
| 5,520,992 | 5/1996 | Douglas et al. . |
| 5,555,486 | 9/1996 | Kingon et al. . |
| 5,561,307 | 10/1996 | Mihara et al. . |
| 5,566,045 | 10/1996 | Summerfelt et al. . |
| 5,581,436 | 12/1996 | Summerfelt et al. . |
| 5,605,857 | 2/1997 | Jost et al. ............................. 438/253 |
| 5,618,746 | 4/1997 | Hwang . |
| 5,639,698 | 6/1997 | Yamazaki et al. . |

(List continued on next page.)

FOREIGN PATENT DOCUMENTS

| 0 301 725 | * 11/1988 | (EP) . |
| 0 770 862 | 5/1997 | (EP) . |
| 9 162372 | 6/1997 | (JP) . |

Primary Examiner—Carl Whitehead, Jr.
Assistant Examiner—Jeff Vockrodt
(74) Attorney, Agent, or Firm—Mueting, Raasch & Gebhardt, P.A.

(57) ABSTRACT

The present invention provides a method for forming a substantially carbon- and oxygen-free conductive layer, wherein the layer can contain a metal and/or a metalloid material. According to the present invention, a substantially carbon- and oxygen-free conductive layer is formed in an oxidizing atmosphere in the presence of an organometallic catalyst using, for example, a chemical vapor deposition process. Such layers are particularly advantageous for use in memory devices, such as dynamic random access memory (DRAM) devices.

26 Claims, 2 Drawing Sheets

U.S. PATENT DOCUMENTS

| | | | |
|---|---|---|---|
| 5,654,222 | 8/1997 | Sandhu et al. | 438/3 |
| 5,654,224 | 8/1997 | Figura et al. | 438/396 |
| 5,661,115 | 8/1997 | Sandhu . | |
| 5,663,088 | 9/1997 | Sandhu et al. | 438/396 |
| 5,679,225 * | 10/1997 | Pastacaldi et al. | 204/290 |
| 5,691,009 * | 11/1997 | Sandhu | 427/534 |
| 5,696,384 | 12/1997 | Ogi et al. | 252/182.12 |
| 5,717,250 | 2/1998 | Schuele et al. | 257/754 |
| 5,728,626 | 3/1998 | Allman et al. | 438/608 |
| 5,744,832 * | 4/1998 | Wolters et al. | 257/295 |
| 5,760,474 | 6/1998 | Schuele | 257/754 |
| 5,962,716 | 10/1999 | Uhlenbrock et al. | 556/16 |
| 5,970,378 * | 10/1999 | Shue et al. | 438/656 |
| 5,972,105 | 10/1999 | Yamazaki et al. | 117/8 |
| 5,990,559 | 11/1999 | Marsh | 257/768 |
| 6,074,945 | 6/2000 | Vaartstra et al. | 438/681 |
| 6,127,257 | 10/2000 | Pintchovski et al. | 438/625 |
| 6,133,159 | 10/2000 | Vaarstra et al. | 438/758 |

OTHER PUBLICATIONS

Green et al., "Chemical Vapor Deposition of Ruthenium and Ruthenium Dioxide Films," *J. Electrochem. Soc.*, 132, 2677–2685 (1985).

Johnson et al., "Chemistry", *Nature*, 901–902 (1967).

Liao et al., "Characterization of RuO2 thin films deposited on Si by metal–organic chemical vapor deposition," *Thin Solid Films*, 287, 74–79 (1996).

Macchioni et al., "Cationic Bis– and Tris(η2–(pyrazol–1–y1)methane) Acetyl Complexes of Iron (II) and Ruthenium (II): Synthesis, Characterization, Reactivity and Interionic Solution Structure by Noesy NMR Spectroscopy," *Organometallics*, 16, 2139–2145 (1997).

Versteeg et al., "Metalorganic Chemical Vapor Deposition By Pulsed Liquid Injection Using An Ultrasonic Nozzle: Titanium Dioxide on Sapphire from Titanium (IV) Isopropoxide," *Journal of the American Ceramic Society*, 78, 2763–2768 (1995).

Bhatt et al., "Novel high temperature multi–layered electrode barrier structure for high–density ferroelectric memories," *Appl. Phys. Lett.*, 71, 719–721 (1997).

Cohan et al., "Laser–assisted organometallic chemical vapor deposition of films of rhodium and iridium," *Appl. Phys. Lett.*, 60, 1402–1403 (1992).

Doppelt et al., "Mineral precursor for chemical vapor deposition of Rh metallic films," *Mater. Sci. Eng.*, 817, 143–146 (1993).

Etspuler et al., "Deposition of Thin Rhodium Films by Plasma–Enhanced Chemical Vapor Deposition,"*Appl. Phys. A*, 48, 373–375 (1989).

Hoke et al., "Low–temperature Vapour Deposition of High–purity Iridium Coatings from Cyclooctadiene Complexes of Iridium," *J. Mater. Chem.*, 1, 551–554 (1991).

Hsu et al., "Synthesis and X–ray structure of the heteronuclear cluster (β–H)$_2$(η$^5$–C$_5$H$_5$)IrOs$_3$(CO)$_{10}$," *Journal of Organometallic Chemistry*, 426, 121–130 (1992).

Kaesz et al., "Low–Temperature Organometallic Chemical Vapor Deposition of Transition Metals," *Mat. Res. Soc. Symp. Proc.*, 131, 395–400 (1989).

Khakani et al., "Pulsed laser deposition of highly conductive iridium oxide thin films," *Appl. Phys. Lett.*, 69, 2027–2029 (1991).

Kumar et al., "New precursors for organometallic chemical vapor deposition of rhodium," *Can. J. Chem.*, 69, 108–110 (1991).

Lu et al., "Ultrahigh vacuum chemical vapor deposition or rhodium thin films on clean and TiO$_2$–covered Si(111)," *Thin Solid Films*, 208, 172–176 (1992).

Macomber et al., "The Synthesis and $^1$H NMR Study of Vinyl Organometallic Monomers: (η$^5$–C$_5$H$_4$CH+CH$_2$)M(CO)$_2$(NO) (M + Cr, Mo, W) and (η$^5$–C$_5$H$_4$CH+CH$_2$)M(CO)$_2$ (M + Co, Rh, Ir,)," *Journal of Organometallic Chemistry*, 250, 311–318 (1983).

Pathangey et al., "Various approaches have been explored to obtain atomic layer controlled growth, but one of the most straightforward growth techniques is molecular beam epitaxy (MBE)," *Vacuum Technology and Coating*, 33–41 (May 2000).

Rausch et al., "Isolation and Structural Characterization of Bis(η$^5$–cyclopentadienyl)bis(carbonyl)–β–(o–phenylene)–diiridium (Ir–Ir), (C$_5$H$_5$)$_2$Ir$_2$(C$_6$H$_4$): A Product Formally Derived from the Double Oxidative Addition of Benzene to Iridium," *J. Amer. Chem. Soc.*, 99, 7870–7876 (1977).

Smith et al., "Low–Temperature Chemical Vapor Deposition of Rhodium and Iridium Thin Films," *Mat. Res. Soc. Symp. Proc.*, 168, 369–374 (1990).

Suntola, "Atomic layer epitaxy," *Thin Solid Films*, 216, 84–89 (1992).

Uchida et al., "Preparation of organoiridium compound for metalorganic chemical vapor deposition (MOCVD) of thin film of iridium or iridium oxide," (Abstract of JP 08,306, 627) *CA Selects: Chemical Vapor Deposition*, 5, 1, Abstract No. 126:89572d (1997).

Van Hemert et al., "Vapor Deposition of Metals by Hydrogen Reduction of Metal Chelates," *J. Electrochem. Soc.*, 112, 1123–1126 (1965).

Burkhard Niemer et al., Organometallic chemical vapor deposition of tungsten metal and suppression of carbon incorporation by codeposition of platinum, Oct. 12, 1992, Appl. Phys. Lett. 61 (15) pp. 1793–1795.*

Takasu et al., Preparation of a novel Pt–RuO2/Ti electrocatalyst by use of highly porous ruthenium oxide supported prepared from RuO2–La2O3/electrode, Sep. 26, 1997, Journal of Alloys and Compounds 261 (1997) 172–175.*

* cited by examiner

STRUCTURES INCLUDING LOW CARBON/OXYGEN CONDUCTIVE LAYERS

This is a division of application Ser. No. 09/146,297, filed Sep. 3, 1998, (pending), which is incorporated herein by reference.

FIELD OF THE INVENTION

This invention relates to the preparation of semiconductor device structures. Particularly, the present invention pertains to methods of forming substantially carbon-free, and, optionally, oxygen-free, conductive layers using an organometallic catalyst.

BACKGROUND OF THE INVENTION

Chemical vapor deposition (hereinafter "CVD") is defined as the formation of a non-volatile solid layer or film on a substrate by the reaction of vapor phase reactants that contain desired components. The vapors are introduced into a reactor vessel or chamber, and decompose and/or react at a heated surface on a wafer to form the desired layer. CVD is but one process of forming relatively thin layers on semiconductor wafers, such as layers of elemental metals or compounds. It is a favored layer formation process primarily because of its ability to provide highly conformal layers even within deep contacts and other openings.

For example, a compound, typically a heat decomposable volatile compound (also known as a precursor), is delivered to a substrate surface in the vapor phase. The precursor is contacted with a surface which has been heated to a temperature above the decomposition temperature of the precursor. A coating or layer forms on the surface. The layer generally contains a metal, metalloid, alloy, or mixtures thereof, depending upon the type of precursor and deposition conditions employed.

Precursors typically utilized in CVD are generally organometallic compounds, wherein a hydrocarbon portion of the precursor functions as the carrier for the metal or metalloid portion of the precursor during vaporization of the liquid precursor. For microelectronic applications, it is often desirable to deposit layers having high conductivity, which generally means that the layers should contain minimal carbon and oxygen contaminants. However, one problem of a CVD deposited layer formed from an organometallic precursor is incorporation of residual carbon from the hydrocarbon portion of the precursor and oxygen that may be present in the atmosphere during deposition. For example, oxygen incorporation into the layer before or after deposition generally results in higher resistivity. Further, it is also believed that organic incorporation (such as pure carbon or hydrocarbon) into the resultant layer reduces density and conductivity. A low density layer can subsequently lead to oxygen incorporation into the layer when it is exposed to ambient air.

Conductive layers formed by CVD processing can be used in the fabrication of various integrated circuits. For example, capacitors are the basic energy storage components in storage cells of memory devices, such as dynamic random access memory (DRAM) devices, static random access memory (SRAM) devices, and even in ferroelectric memory (FE) devices. As memory devices become more dense, it is necessary to decrease the size of circuit components. One way to retain storage capacity of memory devices and decrease its size is to increase the dielectric constant of the dielectric layer of the capacitor component. Such components typically consist of two conductive electrodes insulated from each other by a dielectric material. In order to retain storage capacity and to decrease the size of memory devices, materials having a relatively high dielectric constant can be used as the dielectric layer of a storage cell. Materials having relatively high dielectric constants are generally formed on a device surface as thin layers. Generally, high quality thin layers of metals and conductive metal oxides, nitrides, and silicides, are used as electrode materials for storage cell capacitors. To be effective electrodes, low resistivity is desired. Therefore, layers having low carbon and/or oxygen content are desired. Further, various applications also require such low resistivity conductive layers, e.g., contacts, interconnects, etc. In addition, the presence of carbon in an electrode layer may "poison" the dielectric layer thus, reducing the effectiveness of the capacitor.

SUMMARY OF THE INVENTION

Thus, what is yet needed are methods for forming substantially carbon- and oxygen-free conductive layers useful for semiconductor structures, that can be used in microelectronic devices, such as memory devices. For example, a substantially carbon- and oxygen-free layer is desirable when a conductive material, e.g., ruthenium, is used as a conductive layer. In general, such a conductive layer preferably contains unoxidized or relatively minor amounts of oxidized metal or metalloid which, in large amounts, can adversely affect its characteristics. Further, conductive layers containing relatively large amounts of carbon and/or oxygen do not provide adequate conductivity characteristics.

Advantageously, the present invention provides a method for forming a substantially carbon-free and, optionally, oxygen-free layer including a metal- or metalloid containing material. Preferably, a method according to the present invention includes forming a layer in the presence of an organometallic catalyst. The present invention also provides a substantially carbon-free and, optionally, a substantially oxygen-free conductive layer that can be used as a barrier layer, and/or an adhesion layer, on an electrode, or any other conductive layer in an integrated circuit structure, such as in a capacitor of a memory device.

A method according to the present invention is particularly well suited for forming layers on a surface of a semiconductor substrate or substrate assembly, such as a silicon wafer, with or without layers or structures formed thereon, used in forming integrated circuits. It is to be understood that a method according to the present invention is not to be limited to layer formation on silicon wafers; rather, other types of wafers (e.g., gallium arsenide wafer, etc.) can be used as well. A method according to the present invention can also be used in silicon-on-insulator technology. The layers can be formed directly on the lowest semiconductor surface of the substrate, or they can be formed on any of a variety of layers (i.e., surfaces) as in a patterned wafer, for example. Thus, the term "semiconductor substrate" refers herein to a base semiconductor layer, e.g., the lowest layer of silicon material in a wafer or a silicon layer deposited on another material such as silicon or sapphire. The term "semiconductor substrate assembly" refers herein to a semiconductor substrate or a substrate having one or more layers or structures formed thereon.

Accordingly, one aspect of the present invention provides a method for use in fabrication of integrated circuits. Preferably, the method includes the steps of forming a substrate assembly having a surface and forming a substantially carbon- and oxygen-free layer from a precursor comprising a conductive material in an oxidizing atmosphere and in the presence of an organometallic catalyst. A metal portion of the organometallic catalyst is preferably different than the conductive material of the precursor.

As used herein, "substantially carbon-free" refers to an amount of carbon present in a layer that is preferably about 1.0% by atomic percent or less, more preferably about 0.1% by atomic percent or less, and most preferably about 0.05% by atomic percent or less. If used, "substantially oxygen-free" refers to an amount of oxygen present in a layer that is preferably about 1.0% by atomic or less, more preferably about 0.5% by atomic or less, and most preferably about 0.1% by atomic or less.

Preferably, the metal portion of the organometallic catalyst is selected from the group consisting essentially of platinum, palladium, rhodium, and iridium and the material is selected from the group consisting essentially of a metal, a metalloid, and mixtures thereof. The metal and the metalloid can each be in the form of a sulfide, a selenide, a telluride, a nitride, a silicide, an oxide, and mixtures thereof. The material is preferably selected from the group consisting essentially of titanium, tantalum, ruthenium, osmium, iron, rhodium, cobalt, nickel, iridium, cerium, tungsten, aluminum, copper, and mixtures thereof.

Additionally, the method of the present invention provides that the substantially carbon- and oxygen-free layer can further include a metal selected from the group consisting essentially of platinum, palladium, rhodium, and iridium. Preferably, the metal portion from the organometallic catalyst included in the substantially carbon- and oxygen-free layer is in an amount no greater than about 20% by atomic percent.

Preferably, the step of forming the substantially carbon- and oxygen-free conductive layer includes depositing a precursor by chemical vapor deposition in the presence of a platinum-containing organometallic catalyst. More preferably, the precursor includes a material selected from the group consisting essentially of titanium, tantalum, ruthenium, osmium, iron, rhodium, cobalt, nickel, iridium, cerium, tungsten, aluminum, copper, and mixtures thereof.

Another aspect of the present invention provides a method for use in formation of a capacitor. Preferably, the method includes the steps of forming a surface of a substrate assembly and forming a first electrode on at least a portion of the surface of the substrate assembly. Preferably, the first electrode includes a substantially carbon- and oxygen-free layer deposited in an oxidizing atmosphere in the presence of an organometallic catalyst, wherein the substantially carbon- and oxygen-free layer is formed from a conductive metal-containing precursor, wherein the conductive metal of the precursor is not the same as a metal portion of the organometallic catalyst. The method also includes the steps of forming a dielectric material over at least a portion of the first electrode; and forming a second electrode on at least a portion of the dielectric material.

Preferably, the step of forming the substantially carbon- and oxygen-free conductive layer includes forming a substantially carbon- and oxygen-free layer by chemical vapor deposition. The substantially carbon- and oxygen-free conductive layer may also be a substantially carbon- and oxygen-free conductive barrier layer.

Yet another aspect of the present invention provides a semiconductor structure. Typically, the semiconductor structure includes a substrate assembly including a surface and a substantially carbon- and oxygen-free conductive layer comprising a major portion of a conductive material and a minor portion of a metal selected from the group consisting essentially of platinum, paladium, rhodium, and iridium, wherein the major portion of the conductive material is not the same as the minor portion of the metal. Preferably, the minor portion comprises about 20% by atomic percent or less of the substantially carbon- and oxygen-free conductive layer.

The substantially carbon- and oxygen-free conductive layer preferably includes a material selected from the group consisting essentially of titanium, tantalum, ruthenium, osmium, iron, rhodium, cobalt, nickel, iridium, cerium, tungsten, aluminum, copper, and mixtures thereof. Thus, in the semiconductor structure of the present invention, the substantially carbon- and oxygen-free conductive layer may be at least one of a semiconductor structure selected from the group consisting essentially of an electrode layer, an electrode, a barrier layer, a contact layer, an interconnect component, and an adhesion layer.

A further aspect of the present invention provides a semiconductor structure that typically includes a substrate assembly including a surface and a substantially carbon-free conductive layer comprising a major portion of a conductive metal oxide and a minor platinum portion. Preferably, the minor platinum portion comprises about 20% by atomic percent or less of platinum in the substantially carbon-free conductive layer.

The substantially carbon-free conductive layer may include a major portion of a metal oxide selected from the group consisting essentially of aluminum oxide, titanium oxide, tungsten oxide, ruthenium oxide, osmium oxide, iridium oxide, rhodium oxide, tantalum oxide, cobalt oxide, copper oxide, and mixtures thereof.

Yet a further aspect of the present invention provides a memory cell structure including a substrate assembly including at least one active device and a capacitor formed relative to the at least one active device. The capacitor comprises at least one electrode including a substantially carbon- and oxygen-free conductive layer, wherein the substantially carbon- and oxygen-free conductive layer comprises a major portion of a conductive material selected from the group consisting essentially of titanium, tantalum, ruthenium, osmium, iron, rhodium, cobalt, nickel, iridium, cerium, tungsten, aluminum, copper, and mixtures thereof; and a minor portion of a metal selected from the group consisting essentially of platinum and paladium.

The capacitor may further include a first electrode formed on a silicon-containing region of the at least one active device; a dielectric material on at least a portion of the first electrode; and a second electrode on the high dielectric material, wherein the first electrode comprises the substantially carbon- and oxygen-free conductive layer. The substantially carbon- and oxygen-free conductive layer may be at least one of a semiconductor structure selected from the group consisting essentially of an electrode layer, an electrode, a barrier layer, a contact layer, an interconnect component, and a bond pad.

Another aspect of the present invention provides a method for forming a substantially carbon- and oxygen-free conductive layer. Preferably, the method includes forming a substrate assembly including a heated surface; forming a reactor chamber having an oxidizing atmosphere within the chamber; supplying a precursor to the reactor; and supplying an organometallic catalyst to the reactor. Preferably, the substantially carbon- and oxygen-free conductive layer forms on the heated surface. The oxidizing atmosphere may include a compound selected from the group consisting essentially of oxygen, ozone, nitrous oxide, hydrogen peroxide, $R_2O_2$, and a combination thereof, wherein R is selected from the group consisting of a saturated or unsaturated linear, branched or cyclic hydrocarbon group having about 1 carbon atom to about 20 carbon atoms, preferably about 2 carbon atoms to about 12 carbon atoms, for example, methyl, ethyl, isopropyl, t-butyl, heptyl, dodecyl, octadecyl, amyl, 2-ethylhexyl, and the like. Preferably, the reaction chamber is at a pressure of about 0.5 torr to about 50 torr.

The method of the present invention may also include the step of supplying a reactive, gas to the reactor, wherein the reactive gas is selected from the group consisting essentially of nitrogen-containing gases, silane, hydrogen sulfide, and mixtures thereof.

Another aspect of the present invention provides a method of optimizing components in a conductive layer. Preferably, the method includes the step of forming a conductive layer, wherein forming the conductive layer includes forming a reactor chamber having a known concentration of oxygen in an oxidizing atmosphere; forming a substrate having a heated surface; supplying a fixed amount of a precursor to a reactor; and supplying a fixed amount of an organometallic catalyst to the reactor. The method also includes the step of analyzing the conductive layer for component amounts. The steps of forming and analyzing a conductive layer can be repeated, wherein one of the fixed amount of the organometallic catalyst or the concentration of oxygen in the oxidizing atmosphere is varied until carbon is detected in the conductive layer.

Preferably, the fixed amount of the organometallic catalyst is about 15% by atomic percent and is varied by decreasing the fixed amount. Additionally, and preferably, the known concentration of oxygen in the oxidizing atmosphere is about 30% by atomic percent and is varied by decreasing the known amount. The amount of organometallic catalyst can be optimized empirically such that the amount of catalyst can be reduced until carbon is detected in the layer formed.

These and other objects, features and advantages of the present invention will be apparent from the following description of various embodiments and as illustrated in the accompanying figures.

DETAILED DESCRIPTION OF THE EMBODIMENTS

Figure 1:
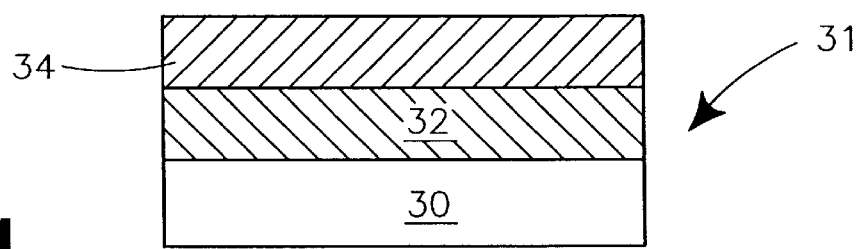
FIG. 1 is a cross-sectional schematic of one embodiment of a structure including a layer formed in accordance with the present invention.

The present invention provides a method for forming a conductive layer that contains substantially no carbon and, optionally, no oxygen using an organometallic catalyst. Preferably, the method includes forming a substantially carbon- and oxygen-free conductive layer from a precursor in the presence of an organometallic catalyst. The resultant substantially carbon- and oxygen-free layer can be a metal, a metalloid, and mixtures thereof. Each of the metal and the metalloid can be in the form of a sulfide, a nitride, a selenide, a telluride, a nitride, a silicide, an oxide, mixtures thereof. Preferably, the substantially carbon- and oxygen-free conductive layer formed is a metal layer. The layer can be deposited in a wide variety of thicknesses, depending upon the desired use. Preferably, the substantially carbon- and oxygen-free layer is a conductive layer that can be used in memory devices, such as DRAM devices.

A. Layer Formation Method

The present invention broadly relates to the formation of a substantially carbon-free and, optionally, a substantially oxygen-free layer. In the present invention, one preferred system for forming a layer is chemical vapor deposition (CVD). CVD is generally a process in which a layer is deposited by a chemical reaction or decomposition of a gas mixture at elevated temperature at a substrate surface or in its vicinity. CVD can be classified into various types in accordance with the heating method, gas pressure, and/or chemical reaction. For example, conventional CVD methods include: (a) cold wall type CVD, in which only a deposition substrate is heated; (b) hot wall type CVD, in which an entire reaction chamber is heated; (c) atmospheric CVD, in which reaction occurs at a pressure of about one atmosphere; (d) low-pressure CVD in which reaction occurs at pressures from about $10^{-1}$ to 100 torr; (e) electron-beam assisted CVD and ion-beam assisted CVD in which the energy from an electron-beam or an ion-beam directed towards the substrate provides the energy for decomposition of the precursor; (f) plasma assisted CVD and photo-assisted CVD in which the energy from a plasma or a light source activates the precursor to allow depositions at reduced substrate temperatures; and (g) laser assisted CVD wherein laser light is used to heat the substrate or to effect photolytic reactions in the precursor gas. In the cold wall type CVD, heating of substrates in a CVD reactor may be accomplished by several method including the use of hot stages or induction heating.

Broadly, thermal CVD includes any type of apparatus in which the substrates and/or the gaseous precursor is heated and could include standard thermal reactors such as cold wall/hot substrates reactors and hot wall type reactors, as well as radiation beam reactors in which a beam (such as a laser beam) is used to heat the substrate and/or to decompose gaseous precursor.

In a typical CVD process, a substrate on which deposition is to occur is placed in a reaction chamber, and is heated to a temperature sufficient to cause the decomposition of vapors of the precursor, as described below. When these vapors are introduced into the reaction chamber and transported to the vicinity of the substrate, they will decompose thereon to deposit a layer containing a metal or metalloid.

For example, in a thermal reactor CVD system it is preferable that the decomposition reaction occur at the substrate, and for this reason it is preferable to heat the substrate to a temperature in excess of the decomposition temperature of the precursor. Similarly, in a radiation beam induced CVD technique, the radiation (such as an ion beam) is preferably used to heat the substrate so that decomposition of the precursor occurs as the substrate.

These CVD processes can be used to provide blanket deposition of metal or metalloid layers on substrates. These layers can then be patterned by conventional lithography methods, if desired. Additionally, selected area depositions may be accomplished by energy beam assisted CVD where a beam of energy, such as an ion beam, selectively heats small portions of the substrate.

Any CVD apparatus design may be used in the present invention including hot wall reactors, cold wall reactors, radiation beam assisted reactors, plasma assisted reactors, and the like. For blanket depositions, a cold wall-hot substrate reactor may sometimes be preferred as this design is efficient in regards to precursor consumption. For selected area depositions, a radiation beam assisted reactor may be preferred as the radiation beam may be used to "write" metal containing layers onto small areas of the substrate.

In the present invention, a method for forming a substantially carbon- and oxygen-free metal- or metalloid-containing layer is preferably conducted using a CVD process in the presence of an organometallic catalyst. Preferably the method is carried out in the presence of an oxidation gas, and under a dynamic vacuum of about 0.5 to 50 torr in a standard cold-wall, CVD reactor chamber. Typically, a precursor is contained in a precursor bubbler, that is typically heated, at one end of the reactor and is exposed to a vacuum by flowing an inert carrier gas through the heated bubbler to vaporize the precursor. Additionally, an organometallic catalyst is contained in a catalyst bubbler, that is typically heated, in proximity to the precursor reservoir. The organometallic catalyst is carried to a vacuum by flowing a carrier gas through the heated bubbler which vaporizes the organometallic catalyst. Preferably, vaporization of the precursor and the organometallic catalyst is accomplished substantially simultaneously. The vacuum can be provided by a suitable vacuum pump positioned at the opposite end of reaction chamber. The precursor vapor and organometallic catalyst vapor each then pass into a reaction chamber that contains one or more units of the substrate. The substrate, e.g., wafers, are preferably held in a vertical or a horizontal position by a suitable holder. The reaction chamber is maintained at a preselected temperature, by means of an external furnace or an internal heater chuck, which is effective to decompose the precursor vapor and the organometallic catalyst vapor so as to deposit a layer on the exposed surfaces of the substrate units. Preferably, the reaction chamber is maintained at about 150° C.–700° C., more preferably at about 200° C.–500° C., during the deposition process.

Generally, vacuum systems are used for CVD of the metal or metalloids. There is a wide range of operation conditions with respect to the pressure in the system, operating pressures of 1 to 100 mtorr have been used in the absence of carrier gas and higher or lower pressures are also acceptable, i.e., up to about 10 torr. These pressures are largely determined by the pumping speed of the vacuum equipment, the chamber volume, the vapor pressure of the precursor and the vapor pressure of the organometallic catalyst. Optionally, a carrier gas can be added to increase the total pressure, which is passed through or over a solid or liquid precursor. The pressure used is typically optimized to yield the maximum conformation or growth rate.

However, it is preferred to conduct the method of the present invention in the presence of an oxidizing atmosphere, more preferably in the presence of an oxidation gas, such as an oxygen-containing gas. Preferred oxidizing atmospheres may include a compound selected from the group consisting essentially of oxygen, ozone, nitrous oxide, hydrogen peroxide, $R_2O_2$, and a combination thereof, wherein R is selected from the group consisting of a saturated or unsaturated linear, branched or cyclic hydrocarbon group having about 1 carbon atom to about 20 carbon atoms, preferably about 2 carbon atoms to about 12 carbon atoms, for example, methyl, ethyl, isopropyl, t-butyl, heptyl, dodecyl, octadecyl, amyl, 2-ethylhexyl, and the like. A carrier gas may also be used and is typically bubbled through the precursor and the organometallic catalyst during vaporization. Preferably, the carrier gas is a non-oxidizing gas, such as helium, argon, nitrogen, neon, krypton, xenon, and mixtures thereof. Additionally, a reactive gas may also be used, which is selected from the group consisting essentially of a nitrogen-containing gas (such as ammonia), silane, hydrogen sulfide, and mixtures thereof, depending upon the desired characteristics of the resulting layer. Accordingly, an optional gas is preferably selected from the group consisting essentially of a carrier gas, a reactive gas, and mixtures thereof. When carrier gases are used, pressures may range from about 0.1 torr to about 760 torr (atmospheric pressure) and are more typically in range of 0.5 to 300 torr, with the pressure chosen to yield the best conformation and a reasonable growth rate.

The precursor and the organometallic catalyst are generally maintained at a constant temperature during the vaporization process for ease of handling. The temperature is necessarily below the respective decomposition temperature, but at a temperature such that it is sufficiently capable of being volatilized in the process of chemical vapor deposition.

Prior to initiating CVD, the substrates, such as silicon wafers are pre-cleaned by the standard means of sequential soaking in baths such as tetrachloroethane, methanol, distilled water, dilute hydrofluoric acid, and distilled water, for example. The wafers are placed in the CVD reaction chamber. The temperature is typically about at least as high as the melting point of the precursor and the organometallic catalyst, so that the precursor and the organometallic catalyst, each vaporize and the wafer surface is exposed to the vapors of for a time sufficient to produce a layer; typically about 1 minute or less.

Generally, a layer so formed has a thickness of about 200 angstroms to about 500 angstroms, although the thickness of the layers may be altered by the time of exposure to the vapors, depending upon the desired use of the layer. The layers so formed are generally smooth and highly reflective upon visual inspection. Surprisingly, a resulting conductive layer is formed on the substrate surface (including metals or metalloids from the precursor) that is substantially carbon- and oxygen-free when formation takes place in the presence of an organometallic catalyst. This is true even when the formation of the layer occurs in an oxidizing atmosphere. However, in some instances, it may be advantageous to form a layer that includes some amount of carbon and/or oxygen. Accordingly, it is within the scope of the present invention to provide a method that is adaptable to form conductive layers that contain some amounts of carbon and/or oxygen. This can be accomplished by varying the amount of organometallic catalyst, concentration of oxygen in the oxidizing atmosphere, or both.

When a layer containing residual catalyst material is desired, the method of the present invention can be optimized by varying the amount of organometallic catalyst, oxidizer, or both that are added to the CVD reactor. For example, a known ratio of organometallic catalyst to precursor can be added to the reactor and the amount of oxidizer can be decreased. After deposition, substrates can be analyzed using a conventional surface analytical technique such as by x-ray photo electron spectroscopy (XPS) or Auger electron spectroscopy (AES) methods to generate a depth profile. Subsequent deposition reactions can be performed by sequentially decreasing the amount of organometallic catalyst and the oxidizer can be decreased to the point where carbon is observed. The oxidizer typically has a flow rate of about 50 sccm and can be decreased to as low as about 1 sccm. Layers so formed can be analyzed as above for the presence of carbon and/or oxygen. By utilizing this optimization scheme, layer formation conditions can be determined when different conductive metal- or metalloid-containing precursors are used, when it is desirable to minimize catalyst material in the layer, and when it is desirable to adjust layer thickness.

When a substantially carbon- and oxygen-free layer is desired, the organometallic catalyst is utilized in a minor amount, preferably the layer includes about 15% by atomic percent or less of a metal from the organometallic catalyst, more preferably about 10% by atomic percent or less, and more preferably about 5% by atomic percent or less. By example, when a layer is desired that contains about 5% by atomic percent of catalyst material, the optimization scheme typically begins with an initial input of an organometallic catalyst amount of about 5% catalyst carrier flow to the precursor carrier flow.

B. Oryanometallic Catalyst

As discussed above, layer formation in accordance with the present invention is preferably accomplished in the presence of an organometallic catalyst. "Organometallic catalyst," as used herein, means a mononuclear (i.e., monomer) compound having an organic portion and a metallic portion.

As used herein, "organic portion" means a hydrocarbon group that is classified as an aliphatic group, cyclic group, or a combination of aliphatic and cyclic groups (e.g., alkaryl and aralkyl groups). In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group, including, for example, methyl, ethyl, isopropyl, t-butyl, heptyl, dodecyl, octadecyl, amyl, 2-ethylhexyl, and the like. The term "alkenyl group" means an unsaturated linear or branched hydrocarbon group with one or more carbon-carbon double bonds, such as a vinyl group. The term "alkynyl group" means an unsaturated linear or branched hydrocarbon group with one or more triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

The term "group" is used to describe a chemical substituent that includes the unsubstituted group and the group with nonperoxidic O, N, or S atoms, for example, in the chain as well as carbonyl groups or other conventional substitution. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxylalkyls, hydroxylalkyls, sulfoalkyls, etc.

The metal portion of the organometallic catalyst is preferably selected from the group consisting essentially of platinum, paladium, rhodium, and iridium. While not wishing to be bound by any particular theory, it is believed that the metal portion of the organometallic catalyst competitively reacts with the oxidizer to promote the combustion of the organic component of the precursor. A preferable organometallic catalyst is selected from the group consisting essentially of MeCpPtMe$_3$ (where Cp=cyclopentadienyl), CpPtMe$_3$, Pt(acetylacetonate)$_2$, Pt(PF$_3$)$_4$, and Pt(CO)$_2$Cl$_2$.

C. Precursors

Various combinations of compounds described herein can be used in the precursor for chemical vapor deposition. Thus, as used herein, a "precursor" refers to a liquid or solid that includes one or more compounds of the type described herein. The precursor can also include one or more organic solvents suitable for use in chemical vapor deposition, as well as other additives. Preferably, substantially carbon-free and, optionally, substantially oxygen-free layers contain metal or metalloid materials formed from a precursor. A preferred precursor typically contains an organic portion, as defined above, and a metal or metalloid portion, preferably wherein the metal or metalloid of the precursor is not the same as the metal in the organometallic catalyst. In metal- or metalloid-complexes useful as precursors, substitution in the organic portion is often tolerated and is sometimes advisable. Thus, substitution is anticipated in precursors useful in the present invention.

As mentioned above, substantially carbon- and oxygen-free layers formed in accordance with the present invention are preferably conductive, and more preferably include a metal or a metalloid. Suitable metal or metalloid materials for forming a conductive layer can be selected from the group consisting essentially of titanium, tantalum, ruthenium, osmium, iron, rhodium, cobalt, nickel, iridium, cerium, tungsten, aluminum, copper, and mixtures thereof. These materials may also be the oxide form thereof. Advantageously, the method according to the present invention may be utilized to tailor the oxygen content in the oxide form of these materials. This is particularly desirable for use in forming metal oxide films that are essentially carbon-free.

Thus, suitable precursors for forming a conductive film or layer having an organic portion and a metal or metalloid portion in the present invention include, for example, substituted ruthenoscenes and osmoscenes. Suitable precursors can have the formula L$_y$RuX$_2$, wherein L is a neutral or monoanionic ligand selected from the group consisting essentially of linear hydrocarbyls, branched hydrocarbyls, cyclic hydrocarbyls, cyclic alkenes, dienes, cyclic dienes, bicyclic dienes, trienes, cyclic trienes, bicyclic alkenes, bicyclic dienes, bicyclic trienes, tricyclic alkenes, tricyclic dienes, tricyclic trienes, fluorinated derivatives thereof, combinations thereof, and derivatives thereof additionally containing heteroatoms such as a halide, Si, S, Se, P, As, N or O; y has a value from one to three; X is a pi-bonding ligand selected from the group consisting essentially of CO, NO, CN, CS, nitrites, isonitriles, trialkylphosphine, trialkylamine, isocyanide, and combinations thereof; and z has a value from 1 to three, as described in Applicant's Assignee's copending patent application Ser. No. 09/141,236, entitled "Precursor Chemistries for Chemical Vapor Deposition of Ruthenium and Ruthenium Oxide". Other suitable precursors can have the formula (diene)Ru(CO)$_3$, wherein "diene" refers to linear, branched, or cyclic dienes, bicyclic dienes, tricyclic dienes, fluorinated derivatives thereof, combinations thereof, and derivatives thereof additionally containing heteroatoms such as halide, Si, S, Se, P, As, N or O, as described in copending U.S. Ser. No. 09/140,878, dated Aug. 27, 1998. These precursors can be prepared according to the methods described in the above-referenced patent applications or according to the methods described in copending U.S. Ser. No. 09/141,431, dated Aug. 27, 1998, entitled "Methods for Preparing Ruthenium and Osmium Compounds". Other suitable precursors can have the formulae (1) (CO)$_4$ML or (2) M$_2$[$\mu$-($\eta^2$:$\eta^4$-C$_4$R$_4$](CO)$_6$, wherein M is iron, ruthenium, or osmium in formula (1) and L is a two-electron donor ligand and each R is H, halo, OH, alkyl, perfluoroalkyl, or aryl, as described in U.S. Pat. No. 5,376,849 (McCormick et al.). Preferred precursors can be selected from the group of (cyclohexadiene)Ru(CO)$_3$, (cycloheptadiene)Ru(CO)$_3$, bis(isoproplylcyclopentadienyl)ruthenium, bis(isoproplylcyclopentadienyl)osmium; osmium tetrachloride; tris(acetylacentonate)ruthenium; ruthenium carbonyl chloride; and penta(trifluorophosphine)ruthenium.

Conductive barrier layer formation is also possible in accordance with the present invention. Because metal nitrides are particularly useful as barrier films or layers, suitable precursors would be tetrakis-(diethylamino)-titanium, tetrakis-(dimethylamino)-titanium, ethylimido tantalum, terbutylimido-tris-dimethylamino tantalum, and (isopropylcyclopentadienyl)$_2$WH$_2$, that are capable of forming layers containing a nitride form of titanium, tantalum, and tungsten, depending on the precursor used.

D. Substrate Assemblies

Any type of substrate can be used, including metals, graphite, semiconductors, insulators, ceramics and the like as long as the substrate is not substantially deteriorated under the deposition conditions. Such substrates include, but are not limited to, silicon, tin oxide, gallium arsenide (GaAs), silica, glass, alumina, zirconia, as well as polyimide, polymethyl-methacrylate, polystryene, parylene, and other synthetic polymers.

Although the exemplified substrate surfaces are planar, the present process can provide conformal deposition so that the material can be deposited as continuous layers into recesses, trenches, and vias, and over stepped surfaces, such as those which are topologically microstructured including those that may have relatively high aspect ratios. The substrate can be of any desired shape, either regular or irregular. Thus, the substrate can be a rectangular solid or other solid characterized by flat exterior surfaces. Cylindrical surfaces, such as rods and wires, can also be coated according to this invention. Spherical surfaces and other curved surfaces can also be coated. The substrate can even be particulate and/or be hollow, as for example, a tube or a hollow or porous sphere or irregular particle having openings to the exterior. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices. The substrate could also include rough surfaces, such as hemispherical grain polysilicon.

Referring to FIG. 1, a layer 34 is shown deposited on a substrate assembly 31, including one or more layers 30, 32. The layer 34, deposited in accordance with the present invention, includes a metal or metalloid material, which depends upon the composition of the precursor used, and a metal, dependent upon the composition of the organometallic catalyst used. Preferably, the layer 34 is substantially carbon- and oxygen-free. Accordingly, the layer 34 can be thought of as an alloy formed from the metal or metalloid material from the precursor and the metal from the organometallic catalyst. As mentioned above, the layer 34 can also contain minor amounts of carbon and/or oxygen, depending upon the layer forming conditions utilized. Preferably, the layer has a thickness of about 100 angstroms to about 500 angstroms.

Figure 2:
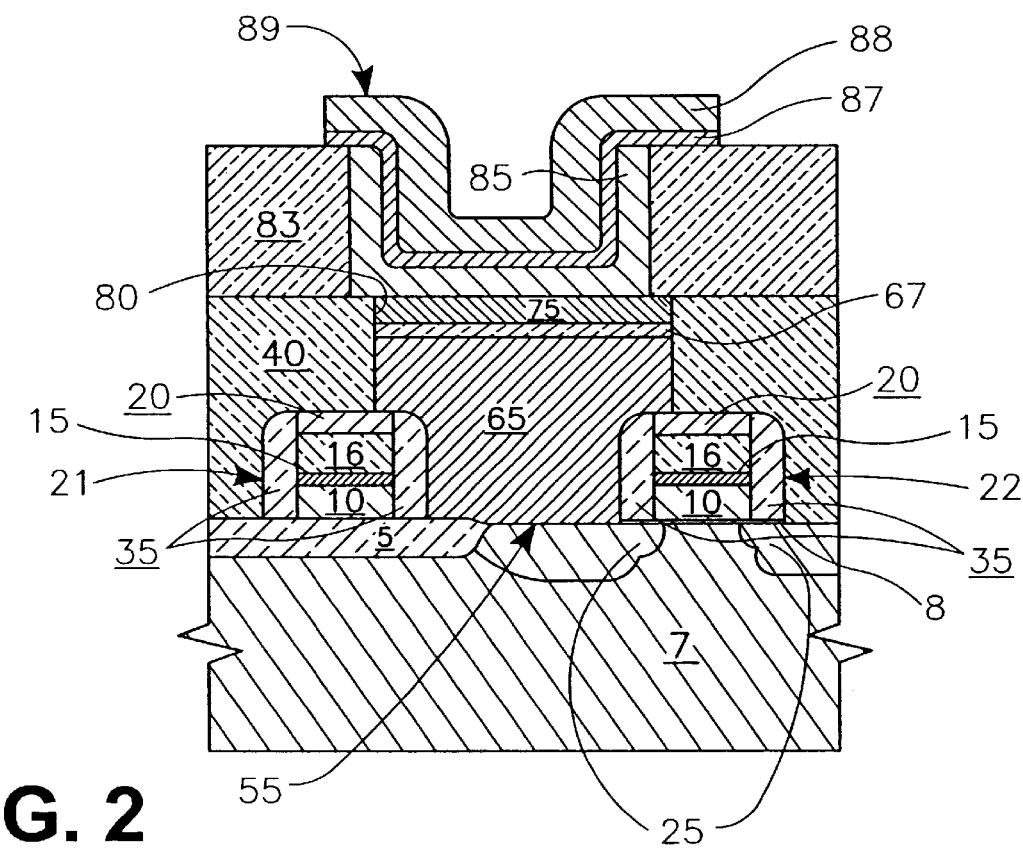
FIG. 2 is a cross-sectional schematic of another embodiment of a capacitor including a layer formed in accordance with the present invention.

Referring to FIG. 2, a cross-sectional view of a portion of a dynamic random access memory (DRAM) cell is shown illustrating the use of the present invention. Typically, a silicon substrate 7 has at least one substantially planar field oxide region 5 formed thereon (generally formed by conventional local oxidation of silicon (LOCOS) or special LOCOS processing). The creation of the field oxide region 5 is preceded or followed by a thermally grown dielectric layer 8, typically of silicon oxide. Following the creation of the field oxide region 5 and the dielectric layer 8, a first conductively doped polysilicon layer 10, a metal silicide layer 15, an oxide layer 16, and a relatively thick nitride layer 20 are deposited. The layers are patterned and etched to form wordlines 21 and N-channel (NCH) field effect transistors 22. The formation of the FETs 22 and wordlines 21 as described are exemplary to one application to be used in conjunction with the present embodiment of the invention. Other methods of fabrication and other applications are also feasible and perhaps equally desirable.

Next, a relatively thick first insulative conformal layer of undoped oxide 40 is blanket deposited to fill the storage node areas and overlie the FETs 22 and wordlines 21. The oxide 40 is planarized, for example by chemical mechanical planarization (CMP), in order to provide a uniform height. Optionally nitride, oxynitride or another suitable material may be deposited as the insulative layer.

The oxide 40 is etched, preferably dry etched, to form self-aligned openings (not labeled) exposing the contact area 55 of the substrate. In order to provide electrical communication between the substrate 7 and a storage cell capacitor 89, a polysilicon plug 65 is formed in each opening. Various methods may be used to form the polysilicon plugs 65, such as a selective silicon growth from the contact area 55 or an in-situ doped polysilicon deposition and subsequent etch back or CMP back. Upper portions of each polysilicon plug 65 is removed during a dry etch in order to form a recess (not labeled). Optionally, a titanium silicide layer 67 overlies the polysilicon plug 65, which provides a first barrier layer.

A second barrier layer 75 is formed by a chemical vapor deposition (CVD), as described above. The barrier layer 75 typically has a thickness that is equal to or greater than the depth of the recess in the oxide layer 40. In general, the titanium silicide layer 67 lowers a contact resistance between the polysicilon plug 65 and the barrier layer 75 which tends to reduce degradation during subsequent processing. The barrier layer 75 tends to prevent diffusion of silicon from the polysilicon plug 65 and the titanium silicide layer 67 during subsequent high temperature anneals. Preferably, the barrier layer 75 contains a conductive metal selected from the group consisting essentially of aluminum, titanium, tungsten, ruthenium, osmium, iridium, rhodium, and mixtures thereof.

Typically, the barrier layer 75 is planarized, preferably by CMP, in order to expose the oxide layer 40 while retaining the barrier layer 75 overlying the titanium silicide 67. Preferably, a sufficient depth of the barrier layer 75 is retained in order to inhibit silicon diffusion of the polysilicon plug 65 and the titanium silicide layer 67. The barrier layer 75 is preferably formed by the layer forming method (i.e., in the presence of an organometallic catalyst) described above, wherein the barrier layer 75 is substantially carbon- and oxygen-free. This is advantageous for two reasons. First, it prevents the poisoning of the high dielectric layer by carbon and, second, high capacity devices can be formed in accordance with the present invention because CVD is particularly well suited for layer formation on surfaces having high aspect ratios. As shown in FIG. 2, only an upper surface of the barrier layer 75 is exposed so that the barrier layer sidewalls 80 are protected by the oxide layer 40.

Preferably, a second relatively thick insulative layer 83 is deposited, patterned and etched to expose at least a portion of the barrier layer 75, thus forming an opening (not labeled) thereon. It is not important that the opening be precisely aligned with the barrier layer 75. Preferably, the second insulative layer 83 includes an oxide, a nitride, an oxynitride, or mixtures thereof. In formation of any insulative layer herein, formation may be accomplished by depositing two separate insulative layers. For example, nitride can be deposited and then an oxide can be deposited over the nitride in accordance with the present invention.

A layer 85, preferably platinum, is formed by CVD over the second insulative layer 83 and exposed portions of the barrier layer 75 to form a lower electrode. It is desirable that the layer 85 is resistant to oxidation to provide a surface for the deposition of a high dielectric constant material. In addition, the layer 85 protects the top surface of the barrier layer 75 from strong oxidizing conditions during deposition of the high dielectric constant material layer 87. Therefore, preferably, platinum, iridium, rhodium, ruthenium, ruthenium oxide, rhodium oxide and iridium oxide can be used as the bottom portion 85 or as one or more layers thereof because it is less likely to oxidize during high dielectric constant material deposition and subsequent anneals. In general, an electrode that forms a nonconductive oxide would result in a low dielectric constant layer beneath the high dielectric constant material, thus negating the advantages provided by the high dielectric constant material.

Following the deposition of the substantially carbon- and oxygen-free layer 85, and dielectric layer 87, a cell plate electrode layer 88 is provided to form a storage node capacitor 89, as shown in FIG. 2.

Figure 3:
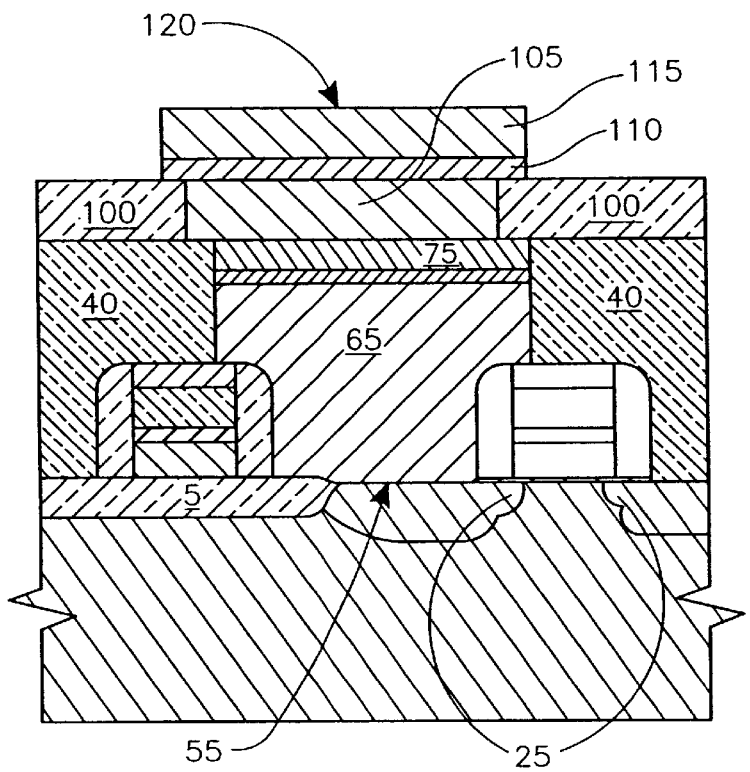
FIG. 3 is a cross-sectional schematic of an alternate embodiment of a layer formed in accordance with the present invention.

Referring now to FIG. 3, a substantially planar capacitor 120 is shown. The wafer portion of FIG. 2 includes a relatively thin insulative layer 100, which has been deposited, patterned and etched such that at least a portion of layer 75 is exposed. A layer of non-oxidizing material forms bottom electrode 105 in accordance with the present invention, as described above with respect to layer 85. A dielectric layer 110 and a top electrode 115 are provided to form the storage node capacitor 120. One skilled in the art will recognize that either one or both of the electrodes may be formed according to the present invention. Further, the present invention may be used to form one or more layers of a stack forming one or both of the electrodes.

Preferably, for many devices, including those described above, materials suitable for forming high dielectric constant material layers are selected from the group consisting essentially of $Ba_xSr_{(1-x)}TiO_3$ [Barium Strontium Titanate or BST], $BaTiO_3$, $SRTiO_3$, $PbTiO_3$, $Pb(Zr,Ti)O_3$ [Lead Zirconium Titanate or PZT], $(Pb,La)(Zr,Ti)O_3$ [PLZT], $(Pb,La)TiO_3$ [PLT], $KNO_3$, $LiNbO_3$, and mixtures thereof. Preferably, cell plate layers, as shown above, are formed with CVD or sputter coating to a thickness of about 50 nm to about 200 nm. Preferably, the electrodes include a conductive material such as those described above and can be formed in accordance with the present invention.

EXAMPLE

The following example is offered to further illustrate preferred embodiments and techniques. It should be understood, however, that many variations and modifications may be made while remaining within the scope of the present invention.

A silicon wafer was placed in a conventional small scale CVD chamber made by Vacuum Products Corp., Hayward, Calif. The organometallic catalyst was $MeCpPtMe_3$, and was supplied with a carrier gas of helium at 5 SCCM. The precursor, $C_6H_8Ru(CO)_3$, was supplied with a carrier gas of helium at 10 SCCM. The oxidizer, oxygen gas, was supplied at 10 SCCM. The organometallic catalyst was held in a bubbler at a pressure of 10 torr and a temperature of 33° C. The precursor was held in a bubbler at a pressure of 10 torr and a temperature of 25° C.

The CVD reaction chamber pressure was 5 torr. The deposition temperature at the wafer surface was 315° C. The deposition reaction was carried out for 5 minutes.

The silicon wafer having the layer deposited thereon was analyzed using a PhI 5600 x-ray photo electron spectroscopy (XPS) from Physical Electronics, Eden Prairie, Minn.

Figure 4:
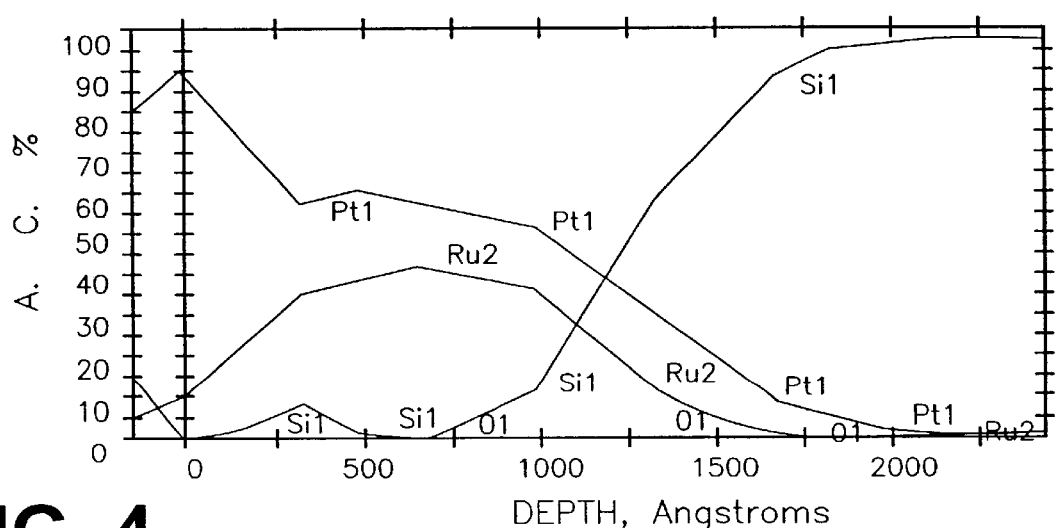
FIG. 4 is a depth profile of a layer formed in accordance with the present invention.

FIG. 4 is a depth profile generated for a wafer having a layer deposited as described above. The figure shows the composition as a function of the depth for the film deposited. FIG. 4 shows that the oxygen content of the Ru—Pt film is below detection limits of XPS (i.e., less than about 0.5% by atomic percent), even though the Ru was co-deposited in an oxygen-containing atmosphere. The carbon levels were also below detection limits.

Surprisingly, the ruthenium layer so formed contained no detectable carbon or oxygen as compared to a layer formed under similar conditions in the absence of the organometallic catalyst, which formed a ruthenium oxide layer. Further, when a conductive layer was formed by sequentially (as opposed to simultaneously) depositing the a conductive layer on a layer formed from a metal portion of the organometallic catalyst, a conductive metal oxide still formed. Accordingly, it is the deposition of the conductive layer in the presence of the organometallic catalyst (i.e., the simultaneous deposition) that prevents the oxidation of the conductive material during deposition, even in an oxidizing atmosphere.

All patents, patent documents, and publications cited herein are incorporated by reference as if each were individually incorporated by reference. Various modifications and alterations of this invention will be apparent to those skilled in the art without departing from the scope and spirit of this invention, and it should be understood that this invention is not limited to the illustrative embodiments set forth herein.

What is claimed is:

1. A semiconductor structure comprising:
    a substrate assembly including a surface;
    a chemical vapor deposited substantially carbon- and oxygen-free conductive layer formed on at least a portion of the surface, wherein the chemical vapor deposited substantially carbon- and oxygen-free conductive layer comprises a major amount of a conductive material corresponding to at least one organometallic precursor and a minor amount of a metal corresponding to an organometallic catalyst, wherein the metal is selected from a group consisting essentially of platinum, palladium, rhodium, and iridium, wherein the conductive material is not the same as the metal, and further wherein the chemical vapor deposited substantially carbon- and oxygen-free conductive layer further comprises 1.0% by atomic percent or less of carbon and 1.0% by atomic percent or less of oxygen.

2. The semiconductor structure of claim 1 wherein the minor amount is about 20% by atomic percent or less of the chemical vapor deposited substantially carbon- and oxygen-free conductive layer.

3. The semiconductor structure of claim 2 wherein the minor amount is about 15% by atomic percent or less of the substantially carbon- and oxygen-free conductive layer.

4. The semiconductor structure of claim 3 wherein the minor amount is about 10% by atomic percent or less of the substantially carbon- and oxygen-free conductive layer.

5. The semiconductor structure of claim 4 wherein the minor amount is about 5% by atomic percent or less of the substantially carbon- and oxygen-free conductive layer.

6. The semiconductor structure of claim 1 wherein the conductive material is selected from a group consisting essentially of titanium, tantalum, ruthenium, osmium, iron, rhodium, cobalt, nickel, iridium, cerium, tungsten, aluminum, copper, and mixtures thereof.

7. The semiconductor structure of claim 1 wherein the chemical vapor deposited substantially carbon- and oxygen-free conductive layer is formed by chemical vapor deposition in an oxidizing atmosphere and in the presence of the organometallic catalyst.

8. The semiconductor structure of claim 1 wherein the conductive material is ruthenium and the metal is platinum.

9. The semiconductor structure of claim 1 wherein the chemical vapor deposited substantially carbon- and oxygen-free conductive layer forms at least a portion of one of an electrode, a barrier layer, a contact layer, an interconnect component, and an adhesion layer.

10. A semiconductor structure comprising:
a substrate assembly including a surface;
a chemical vapor deposited substantially carbon-free conductive layer formed on at least a portion of the surface, wherein the chemical vapor deposited substantially carbon-free conductive layer comprises a major amount of a conductive metal oxide and a minor platinum amount, and further wherein the chemical vapor deposited substantially carbon-free conductive layer further comprises 1.0% by atomic percent or less of carbon.

11. The semiconductor structure of claim 10 wherein the minor platinum amount comprises about 20% by atomic percent or less of platinum in the chemical vapor deposited substantially carbon-free conductive layer.

12. The semiconductor structure of claim 11 wherein the minor amount is about 15% by atomic percent or less of the chemical vapor deposited substantially carbon- and oxygen-free conductive layer.

13. The semiconductor structure of claim 12 wherein the minor amount is about 10% by atomic percent or less of the chemical vapor deposited substantially carbon- and oxygen-free conductive layer.

14. The semiconductor structure of claim 13 wherein the minor amount is about 5% by atomic percent or less of the chemical vapor deposited substantially carbon- and oxygen-free conductive layer.

15. The semiconductor structure of claim 10 wherein the conductive metal oxide of the chemical vapor deposited substantially carbon-free conductive layer comprises ruthenium oxide.

16. The semiconductor structure of claim 10 wherein the chemical vapor deposited substantially carbon-free conductive layer is formed in an oxidizing atmosphere and in the presence of a organometallic catalyst comprising platinum and at least one organometallic precursor corresponding to the conductive metal oxide.

17. A memory cell structure comprising:
a substrate assembly including at least one active device; and
a capacitor formed relative to the at least one active device, the capacitor comprising at least one electrode including a chemical vapor deposited substantially carbon- and oxygen-free conductive layer, wherein the chemical vapor deposited substantially carbon- and oxygen-free conductive layer comprises a major amount of a conductive material selected from a group consisting essentially of titanium, tantalum, ruthenium, osmium, iron, rhodium, cobalt, nickel, iridium, cerium, tungsten, aluminum, copper, and mixtures thereof, wherein the chemical vapor deposited substantially carbon- and oxygen-free conductive layer comprises a minor amount of a metal selected from a group consisting essentially of platinum and palladium, and further wherein the chemical vapor deposited substantially carbon- and oxygen-free conductive layer further comprises 1.0% by atomic percent or less of carbon and 1.0% by atomic percent or less of oxygen.

18. The memory cell structure of claim 17, wherein the capacitor further comprises:
a first electrode formed on a silicon-containing region of the at least one active device;
a dielectric material on at least a portion of the first electrode; and
a second electrode on the dielectric material, wherein the first electrode comprises the chemical vapor deposited substantially carbon- and oxygen-free conductive layer.

19. The memory cell structure of claim 17 wherein the chemical vapor deposited substantially carbon- and oxygen-free conductive layer is formed in an oxidizing atmosphere and in the presence of an organometallic catalyst corresponding to the metal and at least one organometallic precursor corresponding to the conductive material.

20. The memory cell structure of claim 17 wherein the chemical vapor deposited substantially carbon- and oxygen-free conductive layer forms at least a portion of one of an electrode, a barrier layer, a contact layer, an interconnect component, and a bond pad.

21. A memory cell structure comprising:
a substrate assembly including at least one active device; and
a capacitor formed relative to the at least one active device, the capacitor comprising at least one electrode including a substantially carbon- and oxygen-free conductive layer, wherein the substantially carbon- and oxygen-free conductive layer comprises a major amount of a conductive material selected from a group consisting essentially of titanium, tantalum, ruthenium, osmium, iron, rhodium, cobalt, nickel, iridium, cerium, tungsten, aluminum, copper, and mixtures thereof, wherein the substantially carbon- and oxygen-free conductive layer comprises a minor amount of a metal selected from a group consisting essentially of platinum and palladium, wherein the minor amount is about 15% by atomic percent or less of the substantially carbon- and oxygen-free conductive layer, and further wherein the substantially carbon- and oxygen-free conductive layer further comprises 1.0% by atomic percent or less of carbon and 1.0% by atomic percent or less of oxygen.

22. The memory cell structure of claim 21 wherein the minor amount is about 10% by atomic percent or less of the substantially carbon- and oxygen-free conductive layer.

23. The memory cell structure of claim 22 wherein the minor amount is about 5% by atomic percent or less of the substantially carbon- and oxygen-free conductive layer.

24. The memory cell structure of claim 21 wherein the capacitor fiurther comprises:
a first electrode formed on a silicon-containing region of the at least one active device;

a dielectric material on at least a portion of the first electrode; and a second electrode on the dielectric material, wherein the first electrode comprises the substantially carbon- and oxygen-free conductive layer.

25. The memory cell structure of claim 21 wherein the substantially carbon- and oxygen-free conductive layer is formed by chemical vapor deposition in an oxidizing atmosphere and in the presence of an organometallic catalyst corresponding to the metal and at least one organometallic precursor corresponding to the conductive material.

26. The memory cell structure of claim 21 wherein the substantially carbon- and oxygen-free conductive layer forms at least a portion of one of an electrode, a barrier layer, a contact layer, an interconnect component, and a bond pad.

* * * * *

UNITED STATES PATENT AND TRADEMARK OFFICE
CERTIFICATE OF CORRECTION

PATENT NO.    : 6,323,511 B1
DATED         : November 27, 2001
INVENTOR(S)   : Eugene P. Marsh It is certified that error appears in the above-identified patent and that said Letters Patent is hereby corrected as shown below:

Title page,
Item [56], References Cited, OTHER PUBLICATIONS,
In the Macchioni et al. reference, please insert -- , -- after the word "Reactivity".
In the Macchioni et al. reference, please delete "Noesy" and insert -- NOESY -- therefor.
In the Hsu et al. reference, please delete "cluster ($\beta$-H)$_2$" and insert -- cluster, ($\mu$-H)$_2$ -- therefor.
In the Lu et al. reference, please delete "or" and insert -- of -- therefor.
In the Macomber et al. reference, please delete all four "+" signs and insert -- = -- therefor.
In the Rausch et al. reference, please delete "$\beta$" and insert -- $\mu$ -- therefor.
In the Takasu et al. reference, please delete "supported" and insert -- support -- therefor.

Column 5,
Line 11, please delete "," which occurs after the word "reactive".

Column 8,
Line 30, please delete "," which occurs after the word "catalyst".

Column 9,
Line 18, please delete "Oryanometallic" and insert -- Organometallic -- therefor.

Column 10,
Line 40, please delete "$L_y RuX_2$" and insert -- $L_y RuX_z$ -- therefor.

Column 14,
Line 7, please delete the paragraph break which occurs after the word "25ºC."

UNITED STATES PATENT AND TRADEMARK OFFICE
CERTIFICATE OF CORRECTION

PATENT NO.    : 6,323,511 B1
DATED         : November 27, 2001
INVENTOR(S)   : Eugene P. Marsh It is certified that error appears in the above-identified patent and that said Letters Patent is hereby corrected as shown below:

<u>Column 16,</u>
Line 65, please delete "fiurther" and insert -- further -- therefor.

Signed and Sealed this

Twenty-ninth Day of October, 2002

*Attest:*

*Attesting Officer*

JAMES E. ROGAN
*Director of the United States Patent and Trademark Office*